(12) United States Patent
Bobba et al.

(10) Patent No.: US 6,625,791 B1
(45) Date of Patent: Sep. 23, 2003

(54) SLIDING GRID BASED TECHNIQUE FOR OPTIMAL ON-CHIP DECAP INSERTION (75) Inventors: Sudhakar Bobba, Sunnyvale, CA (US); Pradeep Trivedi, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/143,067

(22) Filed: May 10, 2002

(51) Int. Cl.[7] .................................................. G06F 9/45
(52) U.S. Cl. .................................. 716/8; 716/10; 716/9
(58) Field of Search .......................... 716/4, 6, 8, 10, 716/9, 5, 11, 12, 13, 14, 15; 703/2, 18, 16, 9

(56) References Cited

U.S. PATENT DOCUMENTS 6,385,565 B1 * 5/2002 Anderson et al. ............. 703/18
6,487,702 B2 * 11/2002 Lin et al. ....................... 716/4
6,523,159 B2 * 2/2003 Bernstein et al. ............ 716/10
2001/0034587 A1 * 10/2001 Anderson et al. ............. 703/2
2002/0144217 A1 * 10/2002 Lin et al. ....................... 716/4

* cited by examiner

Primary Examiner—Vuthe Siek
Assistant Examiner—Binh Tat
(74) Attorney, Agent, or Firm—Rosenthal&Osha L.L.P.

(57) ABSTRACT

A method and apparatus for optimizing the insertion of decoupling capacitance onto an integrated circuit is provided. Further, a sliding grid based technique for arraying decoupling capacitors into a white-space of an integrated includes sliding a bounded grid across the white-space in order to determine an optimal decap insertion for the white-space. The bounded grid is slid across the white-space in discrete steps. At each discrete step, a potential decap layout is calculated for the region of the white-space that intersects the bounded grid. After a set of potential decap layouts have been calculated for the white-space, the potential decap layout that yields optimal decap insertion is selected, and decap cells are arrayed into the area(s) of the white-space that are demarcated by the selected decap layout.

19 Claims, 6 Drawing Sheets

SLIDING GRID BASED TECHNIQUE FOR OPTIMAL ON-CHIP DECAP INSERTION

BACKGROUND OF INVENTION

Figure 1:
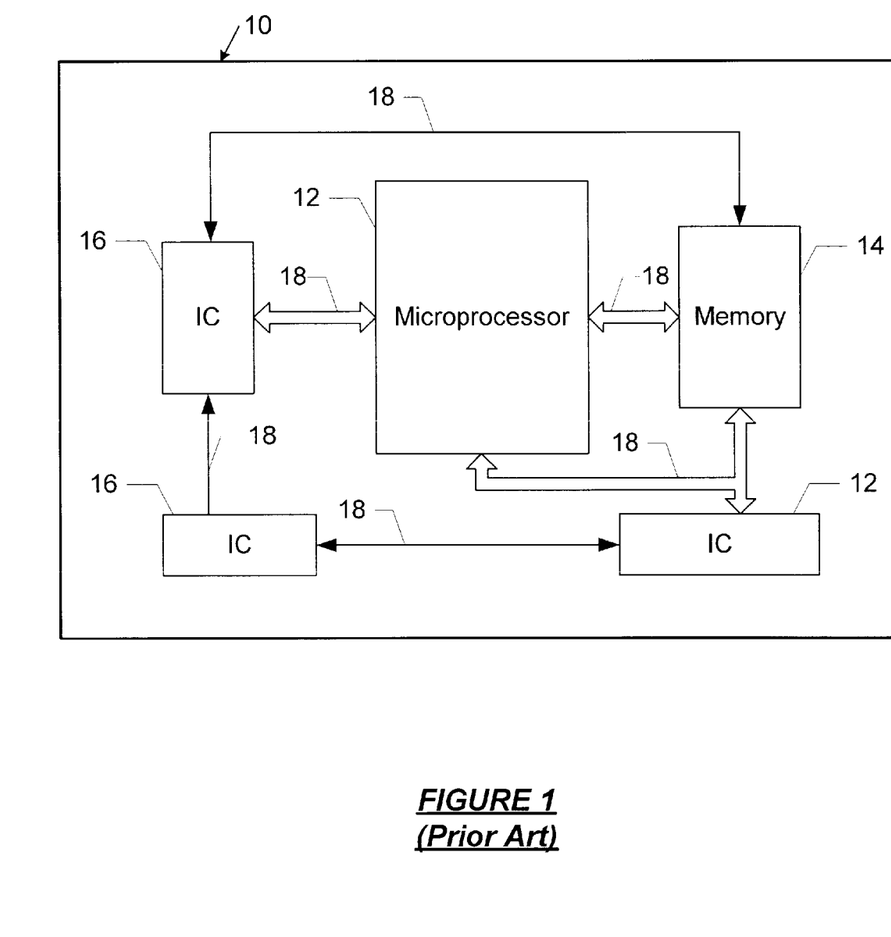
FIG. 1 shows a typical computer system.

A typical computer system includes at least a microprocessor and some form of memory. The microprocessor has, among other components, arithmetic, logic, and control circuitry that interpret and execute instructions necessary for the operation and use of the computer system. FIG. 1 shows a typical computer system (10) having a microprocessor (12), memory (14), integrated circuits (16) all that have various functionalities, and communication paths (18), i.e., buses and wires, that are necessary for the transfer of data among the aforementioned components of the computer system (10).

The various computations and operations performed by the computer system are facilitated through the use of signals that provide electrical pathways for data to propagate between the various components of the computer system. In a general sense, the passing of data onto a signal may occur by either raising the voltage of the signal or reducing the voltage of the signal. When the voltage is raised, the signal is said to be at a "logic high," and when the voltage is reduced, the signal is said to be at a "logic low." Typically, changes in the voltage value of a signal are controlled by a signal driver, e.g., a logic gate, attached to the signal wire on which the signal resides. Switching the logical output of the signal driver from low-to-high or from high-to-low charges or discharges decoupling capacitors associated with the signal wire, which, in turn, raises or lowers the voltage value of the signal.

Usually, decoupling capacitors, referred to herein as "decap cells," are designed as rectangular basic cells that may be arrayed into on-chip white-spaces, i.e., chip regions devoid of logic circuits. White-spaces on an integrated circuit may be located in various regions of the integrated circuit and may be of arbitrary rectilinear shape. Further, white-spaces may be either implicitly present or explicitly created in the design of the integrated circuit.

With the increasing frequency and current requirements of integrated circuits, more on-chip decoupling capacitance, referred to herein as "decap," is required to provide the instantaneous charge requirements of the switching logic gates. As a result, increasing amounts of chip area are required for implementing decap. Thus, it is increasingly important that decap cells be arrayed into a white-space in a floorplan layout that allows as many decap cells as possible to be inserted.

SUMMARY OF INVENTION

According to one aspect of the invention, a method for arraying decoupling capacitors into a white-space of an integrated circuit comprises constructing a bounding box to encompass a periphery of the white-space; overlaying a grid onto a region of the integrated circuit demarcated by the bounding box; calculating a maximum number of decoupling capacitors that can be inserted into the white-space; and arraying the maximum number of decoupling capacitors into the white-space.

According to another aspect, a computer system comprises a processor; a memory; and instructions residing in the memory executable in the processor for constructing a bounding box to encompass a periphery of the white-space; overlaying a grid onto a region of the integrated circuit demarcated by the bounding box; calculating a maximum number of decoupling capacitors that can be inserted into the white-space; and arraying the maximum number of decoupling capacitors into the white-space.

Other aspects and advantages of the invention will be apparent from the following description and the appended claims.

DETAILED DESCRIPTION

Embodiments of the present invention relate to a method and apparatus for optimizing the insertion of decoupling capacitance onto an integrated circuit. Embodiments of the present invention further relate to a method for optimizing the placement of decoupling capacitors into a white-space on an integrated circuit. Embodiments of the present invention further relate to a method for arraying decoupling capacitors onto an integrated circuit in an area-efficient manner.

In one aspect, the present invention involves a sliding grid based technique in which a bounded grid, i.e., a grid whose boundaries are defined by a bounding box, is slid across a white-space on-chip in order to determine an optimal decap insertion for the white-space. The bounded grid is slid across the white-space in discrete steps. At each discrete step, a potential decap layout is calculated for the region of the white-space that intersects the bounded grid. After a set of potential decap layouts have been calculated for the white-space, the potential decap layout that yields optimal decap insertion is selected, and decap cells are arrayed into the area(s) of the white-space that are demarcated by the selected decap layout.

Figure 2A:
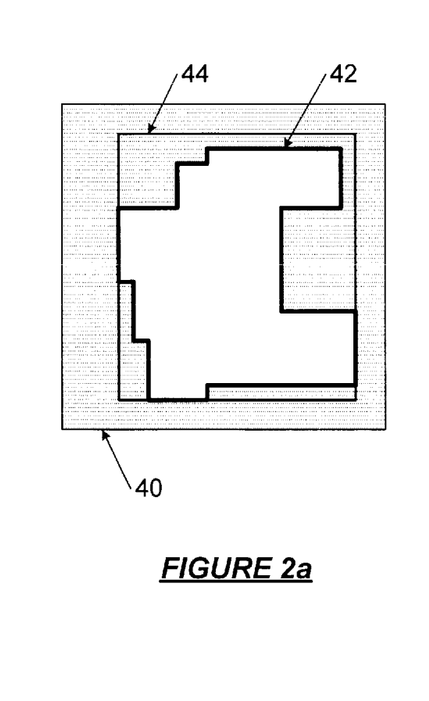
FIGS. 2a–2c show progressive views of a setup process used for a sliding grid based technique in accordance with an embodiment of the present invention.
Figure 2B:
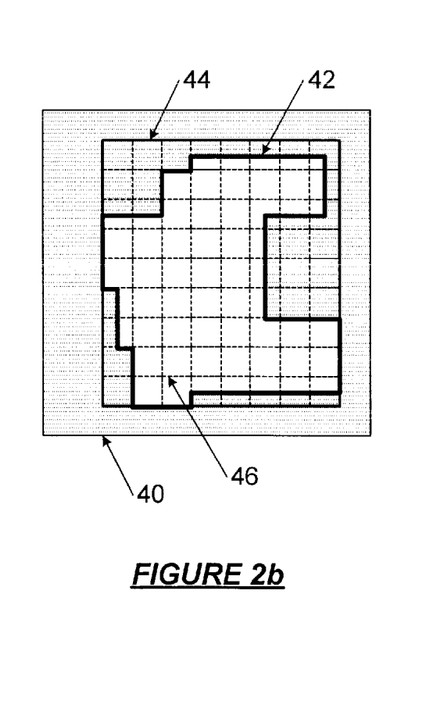
Figure 2C:
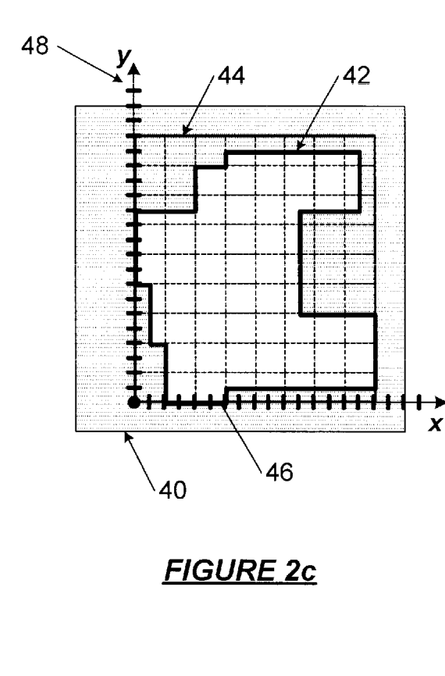

FIGS. 2a–2c show progressive views of a setup process used in a sliding grid based technique in accordance with an embodiment of the invention. FIG. 2a shows an integrated circuit (40) having a white-space (42) overlaid with a bounding box (44) that encloses the periphery of the white-space (42). FIG. 2b shows a bounded grid (46) overlaid onto the integrated circuit region bounded by the bounding box (44). The size and shape of a grid increment, referred to herein as a grid cell, is equal to the size and shape of the particular type of decap cell to be inserted into the white-space. FIG. 2c shows a sliding scale (48), i.e., a horizontal x-axis and a vertical y-axis joined by an origin, superimposed onto the integrated circuit (40) at the origin of the bounded grid (46), i.e., the bottom, lefthand corner of the bounded grid (46). The size of a sliding scale increment is arbitrarily chosen, and may be as large or small as necessary to optimize results obtained with the sliding grid based technique.

Figure 3:
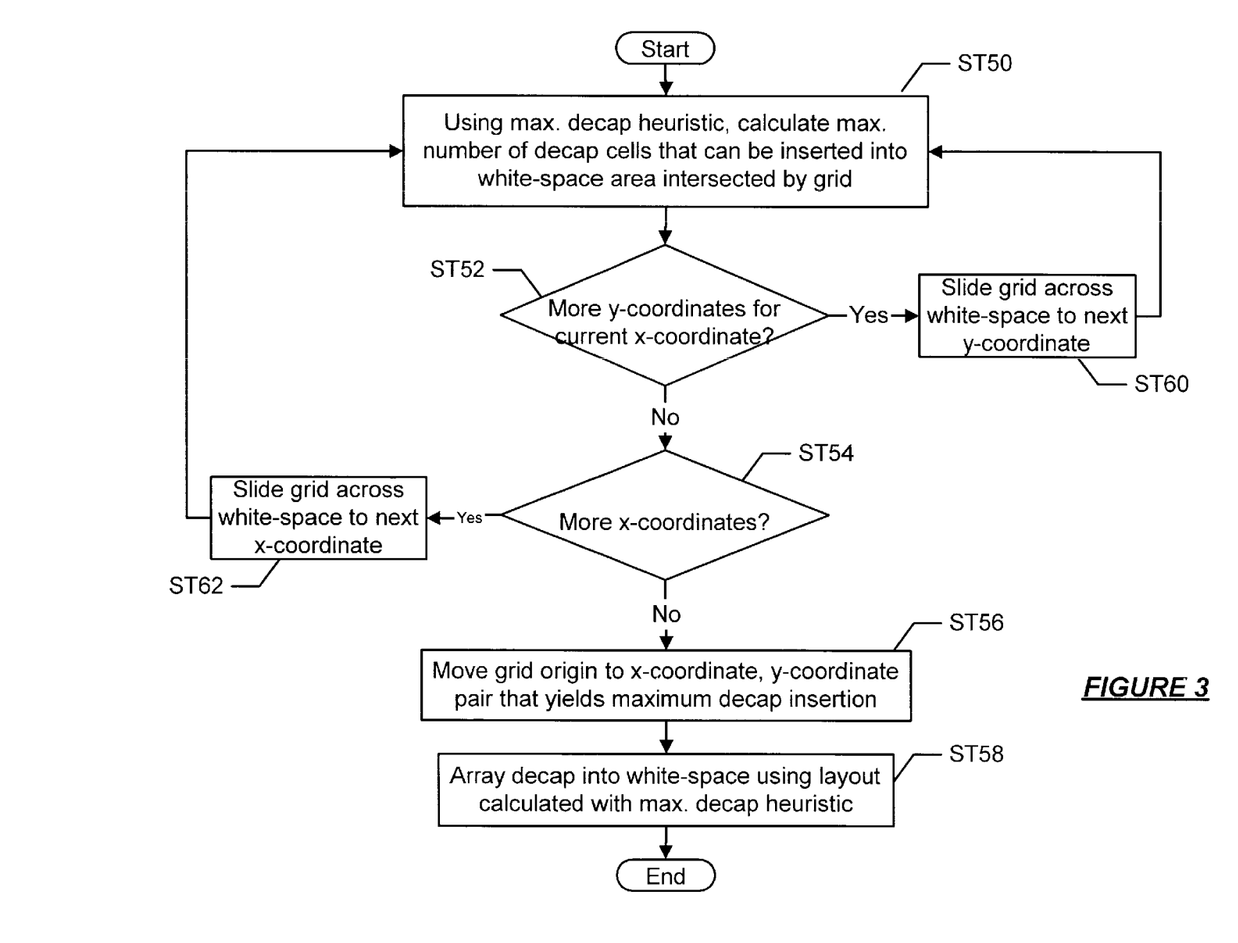
FIG. 3 shows a flow process for a sliding heuristic in accordance with an embodiment of the present invention.

Once the setup process is complete, a set of potential decap layouts is calculated for the white-space (42) by sliding the bounded grid (44) across the white-space (42) according to a sliding heuristic, i.e., an algorithm used to determine the next x,y-position to which the grid origin is slid. FIG. 3 shows a process flow for a sliding heuristic in accordance with an embodiment of the invention. First, before the bounded grid (46) is moved, a potential decap layout is calculated for the original grid position. In the first step (step 50), the potential decap layout is calculated using a maximum decap heuristic. The maximum decap heuristic (shown in FIG. 4) is an algorithm that determines the maximum number of decap cells that may be inserted into the area of the white-space intersected by the bounded grid (46), while still adhering to process constraints, i.e., chip manufacturing requirements, imposed during chip design.

For example, in some embodiments, process constraints may require that a minimum threshold of decap cells be present in any row, column, or region of decap cells in order to facilitate electrical connectivity of the decap cells. Thus, if there are not enough decap cells in a particular section of the white-space, it may not be possible to electrically connect power supply caps to the tops of the decap cells. In addition, process constraints may require that a maximum threshold of decap cells be present in any row, column, or region of decap cells in order to prevent complications during the manufacturing process.

Referring to FIG. 3, once a potential decap layout has been calculated for the current grid position, the next step is to check whether or not there are more y-coordinates to be traversed for the current x-coordinate (step 52). If there are, then the grid origin is slid across to the next y-coordinate of the sliding scale (48) (step 60), and a potential decap layout is calculated for the new grid position using the maximum decap heuristic (step 50).

However, if there are no more y-coordinates for the current x-coordinate, then the next step is to check whether or not there are more x-coordinates to be traversed (step 54). If there are, then the grid origin is slid across the white-space to the next x-coordinate of the sliding scale (48) (step 62), and a potential decap layout is calculated for the new grid position (step 50). Once all of the x,y-coordinate pairs have been traversed, the grid origin is moved to the x,y-coordinate pair whose potential decap layout yields maximum decap insertion (step 56), and decap cells are arrayed into the area(s) of the white-space that are demarcated by the chosen potential decap layout (step 58).

Note that the embodiment shown in FIG. 3 describes a heuristic in which the x,y-coordinate pairs are traversed such that every y-value for a particular x-value is traversed before the next x-value is considered. However, those skilled in the art will appreciate that there are other heuristic conditions which could be used in FIG. 3 without straying from the scope of the invention. For example, every x-value for a particular y-value may be traversed before the next y-value is considered. In addition, a gradient approach in which only some of the x,y-coordinates are traversed may be used, thereby decreasing computation time.

Figure 4:
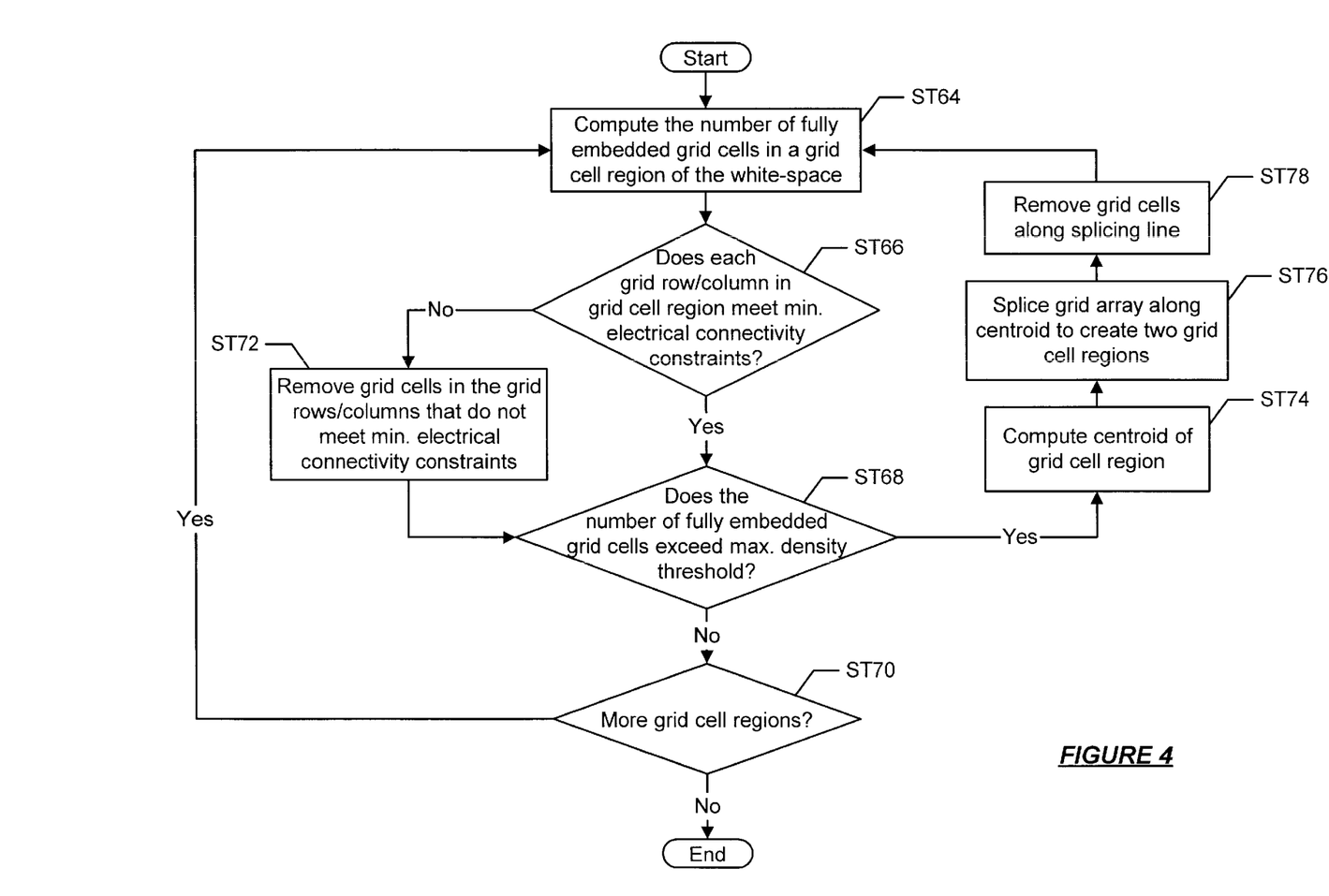
FIG. 4 shows a flow process for a maximum decap heuristic in accordance with an embodiment of the present invention.

FIG. 4 shows a process flow for a maximum decap heuristic used to calculate a potential decap layout in accordance with an embodiment of the present invention. For any particular grid position, the first step in calculating the potential decap layout is to compute the number of grid cells that are fully embedded in the area of the white-space that is intersected by the grid (step 64). Thus, any grid cells that are only partially covered by the white-space are left out of the potential decap layout.

In the remaining steps of FIG. 4, process constraints required by the in current chip design are applied to the grid cells that are included in the potential decap layout. Grid cells that do not adhere to process constraints are removed from the potential decap layout. To this end, the second step is to check whether or not each row/column of fully embedded grid cells meets minimum electrical connectivity constraints (step 66). For example in some embodiments, electrical connectivity constraints may require that each row/column include at least 2 or 4 grid cells to ensure that power supply caps may be electrically connected to the grid cells. Thus, grid cells in any row/column that does not meet minimum electrical connectivity constraints are removed from the potential decap layout (step 72).

Next, the potential decap layout is checked to see whether or not the remaining number of fully embedded grid cells, i.e., those grid cells not removed by the previous two steps (step 66 and step 68), exceeds a maximum density threshold for process manufacturing (step 68). Specifically, in some embodiments, the grid cells in a particular grid cell region may not be processed correctly if the number of grid cells in the grid cell region exceeds a particular user-defined or otherwise predetermined value.

If the number of grid cells in the potential decap layout does exceed the maximum density threshold, then the region of grid cells is divided into smaller regions of grid cells. To this end, the next step is to compute the centroid, i.e., the center point, of the region of grid cells in the potential decap layout (step 74). Then, the grid array is spliced along the shortest axis (horizontal or vertical) of the centroid to create two regions of grid cells (step 76). Splicing the grid array along the shortest axis of the centroid ensures that decap is spread out equally in the white-space, thereby improving on-chip electrical performance, and that each of the two grid cell regions is as large as possible.

Next, the grid cells in the row/column along the splicing line are removed from the potential decap layout (step 78). Thus, the original grid cell region of the potential decap layout is divided into two new separate grid cell regions. Finally, as shown by the last step (step 70) of FIG. 4, the process described above repeated for each of the new grid cell regions. Thus, the maximum decap heuristic is applied to each new subsequently created grid cell region until each grid cell region of the potential decap layout adheres to process constraints.

Note that the embodiment shown in FIG. 4 describes a process in which the grid cells along a splicing line of the grid array are removed to ensure that the grid cell region adheres to a maximum density threshold. However, those skilled in the art will appreciate that there are other processes which could be used in to meet the maximum density threshold without straying from the scope of the invention. For example, in some embodiments, removing an entire row/column of grid cells from the grid array may negatively affect the electrical behavior of the integrated circuit along the periphery of the grid cell region. In such a case, electrical performance may be improved if only the grid cells furthest away from the periphery, i.e., grid cells at and/or near the centroid, are removed from the grid cell array. Thus, the maximum density threshold for process manufacturing may be satisfied without negatively affecting the electrical behavior of the grid cell region.

FIGS. 5a–5b and FIGS. 6a–6c show two physical examples in which the maximum decap heuristic shown in FIG. 4 is applied to the white-space (42) of the integrated circuit (40) shown in FIG. 3. Specifically, FIGS. 5a–5b and FIGS. 6a–6c show progressive views of potential decap layouts calculated for two different positions of the grid (44). For FIGS. 5a–5b and FIGS. 6a–6c, the following process constraints are assumed: (1) a minimum threshold of 2 grid cells is required in each row/column to facilitate electrical connectivity, and (2) a maximum density threshold of 20 grid cells is required for each grid cell region.

Figure 5A:
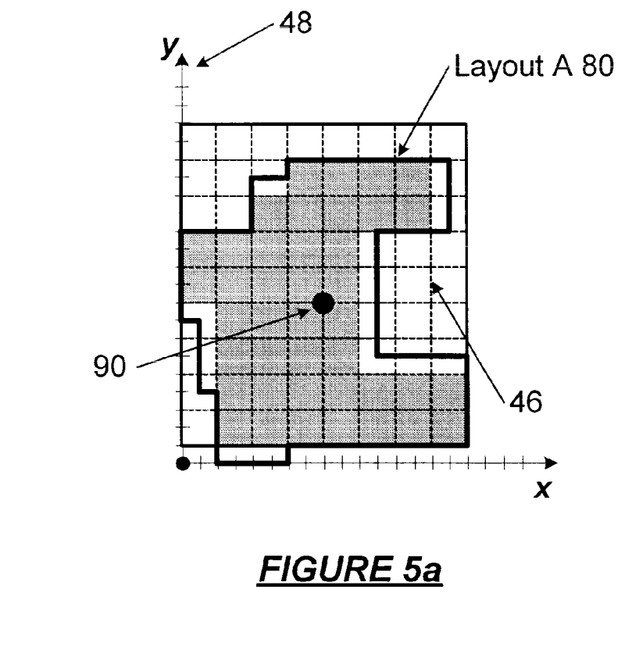
FIGS. 5a–5b show progressive views of a potential decap layout for a white-space in accordance with the embodiment shown in FIG. 3.
Figure 5B:
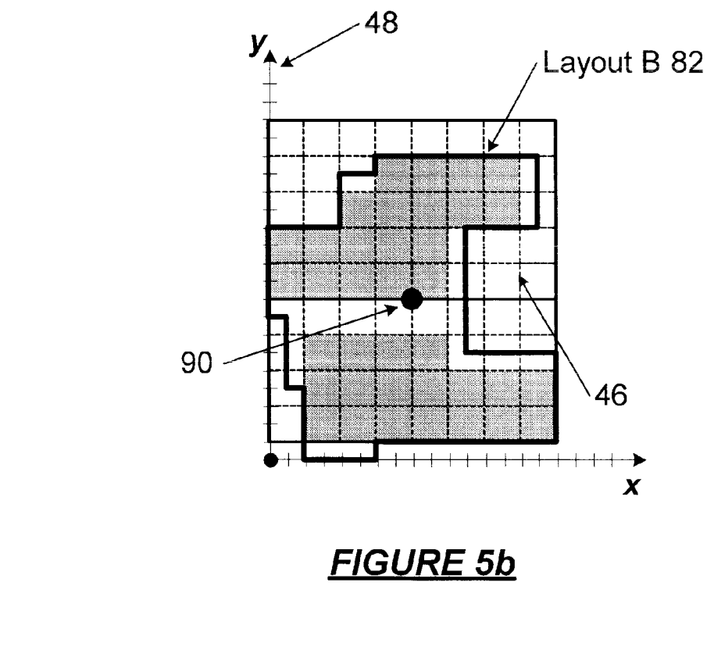

FIGS. 5a–5b show a potential decap layout calculated when the grid (44) is positioned at x,y-coordinate pair (0,1) of the sliding scale (48). As shown in FIG. 5a, layout A (80) includes an original grid cell region of 41 fully embedded grid cells (shaded gray) and a centroid (90), which may be used to splice the original grid cell region. The centroid (90) is located at the intersection point of the horizontal and vertical axes that respectively bisect the length and width of the original grid cell region.

As shown in FIG. 5b, in layout B (82), the original grid cell region of layout A (80) has been spliced into two grid cell regions, referred to herein as an "upper" and a "lower" grid cell region, by removing the shortest row grid cells along the splicing axis. Thus, both the upper grid cell region and the lower grid cell region each include no more than 20 grid cells. In addition, because each row/column of the upper and lower grid cell regions includes a minimum of 2 grid cells, layout B (82) adheres to the process constraints for the chip design. Thus, the potential decap for the current grid position yields a maximum of 37 grid cells: 19 grid cells in the upper grid cell region, and 18 grid cells in the lower grid cell region.

Figure 6A:
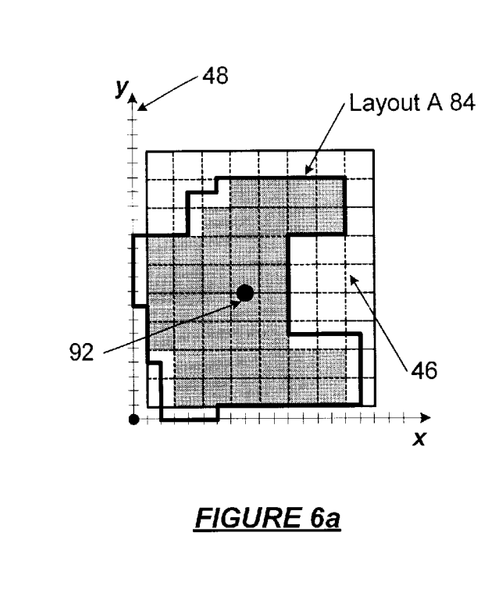
FIGS. 6a–6c show progressive views of an alternative potential decap layout for a white-space in accordance with the embodiment shown in FIG. 3.
Figure 6B:
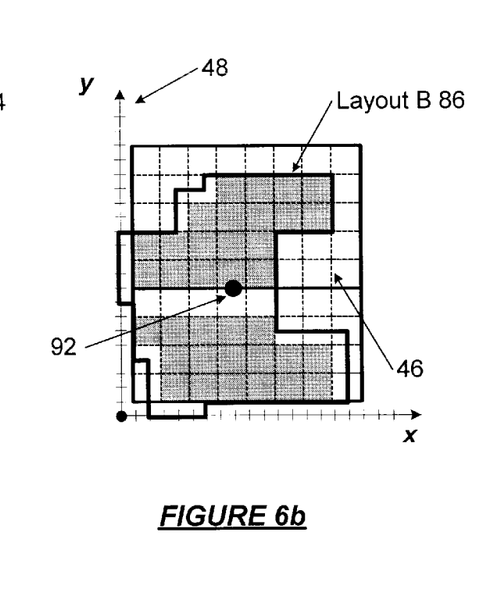
Figure 6C:
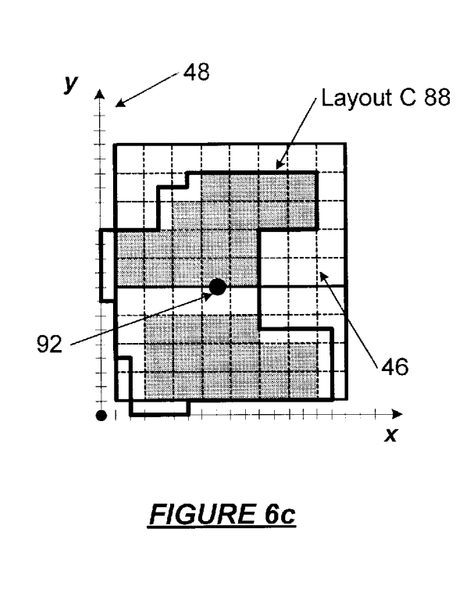

FIGS. 6a–6c show a potential decap layout calculated when the grid (44) is positioned at x,y-coordinate pair (1,1) of the sliding scale (48). As in FIGS. 5a–5b, layout A (84) of FIG. 6a includes a original grid cell region of 41 fully embedded grid cells (shaded gray) and a centroid (92). As shown in FIG. 6b, in layout B (86), the original grid cell region is spliced into two grid cell regions, referred to herein as an "upper" and a "lower" grid cell region, by removing a row of grid cells along the horizontal axis of the centroid (92). Thus, both the upper grid cell region and the lower grid cell region each include no more than 20 grid cells.

However, although layout B (86) adheres to the maximum density threshold required by process constraints, layout B (86) still does not adhere to the minimum threshold of at least 2 grid cells per row/column. To this end, as shown in FIG. 6c, in layout C (88), the column of grid cells having only a single grid cell has been removed from the lower grid cell region. As a result, layout C (88) adheres to the process constraints for the chip design. Thus, the potential decap for the current grid position yields a maximum of 35 grid cells: 19 grid cells in the upper grid cell region, and 16 grid cells in the lower grid cell region.

Those skilled in the art will note that, of the two potential decap layouts calculated in FIGS. 5a–5b and FIGS. 6a–6c, layout B (82) of FIG. 5b yields the maximum decap insertion, while still adhering to process constraints. Thus, if the grid positions in FIG. 5a–5b and FIGS. 6a–6c were the only two grid positions traversed by the sliding heuristic, then layout B (82) of FIG. 5b would be chosen as the decap layout that yields optimal decap insertion. Thus, according to the decap layout shown in layout B (82), a maximum of 37 decap cells may be arrayed into the white-space (42).

Advantages of the present invention may include one or more of the following. In one or more embodiments, because a sliding heuristic is used to calculate a set of potential decap layouts for a white-space of an integrated circuit, a potential decap layout providing optimal decap insertion for the white-space may be chosen from the set of potential decap layouts.

In one or more embodiments, because an optimal decap insertion for a white-space of an integrated circuit is calculated using a maximum decap heuristic, decap cells may be arrayed into the white-space in an area-efficient manner, while still adhering to process constraints.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for arraying decoupling capacitors into a whitespace of an integrated circuit, comprising:

constructing a bounding box to encompass a periphery of the white-space;

overlaying a grid onto a region of the integrated circuit demarcated by the bounding box;

selectively sliding the grid to a plurality of positions across the white-space;

calculating a maximum number of decoupling capacitors that can be inserted into the white-space for the plurality of positions; and arraying the maximum number of decoupling capacitors into the white-space dependent on the calculating.

2. The method of claim 1, wherein the calculating the maximum number of decoupling capacitors that can be inserted into the white-space comprises:

defining a grid cell region covering the white-space; and computing a number of fully embedded grid cells in the grid cell region.

3. The method of claim 1, further comprising:

sliding the grid across the white-space in discrete steps;

performing the calculating at each discrete step to compute a set of potential decoupling capacitor layouts for the arraying of the decoupling capacitors into the white-space; and arraying the maximum number of decoupling capacitors into the white-space in accordance with one of the potential decoupling capacitor layouts computed.

4. The method of claim 2, wherein one decoupling capacitor is inserted into each grid cell of the grid cell region.

5. The method of claim 2, wherein the calculating further comprises determining whether electrical connectivity constraints of the integrated circuit are met by the grid cell region defined.

6. The method of claim 2, wherein the calculating further comprises determining whether the number of fully embedded grid cells computed exceeds a maximum density threshold of the integrated circuit.

7. The method of claim 6, wherein the grid cell region is spliced into a set of smaller grid cell regions if the maximum density threshold is not met.

8. The method of claim 7, wherein the grid cell region is spliced along a centroid of the grid cell region.

9. The method of claim 3, wherein the calculating further comprises determining whether electrical connectivity constraints of the integrated circuit are met by the grid cell region defined.

10. The method of claim 3, wherein the calculating further comprises determining whether the number of fully embedded grid cells computed exceeds a maximum density threshold of the integrated circuit.

11. The method of claim 10, wherein the grid cell region is spliced into a set of smaller grid cell regions if the maximum density threshold is not met.

12. A computer system, comprising:
 a processor;
 a memory; and
 instructions residing in the memory executable in the processor for constructing a bounding box to encompass a periphery of the white-space;
  overlaying a grid onto a region of the integrated circuit demarcated by the bounding box;
  selectively sliding the grid to a plurality of positions across the white-space;
  calculating a maximum number of decoupling capacitors that can be inserted into the white-space for the plurality of positions; and
  arraying the maximum number of decoupling capacitors into the white-space dependent on the calculating.

13. The computer system of claim 12, wherein the calculating the maximum number of decoupling capacitors that can be inserted into the white-space comprises:
 defining a grid cell region covering the white-space; and
 computing a number of fully embedded grid cells in the grid cell region.

14. The computer system of claim 12, further comprising:
 sliding the grid across the white-space in discrete steps;
 performing the calculating at each discrete step to compute a set of potential decoupling capacitor layouts for the arraying of the decoupling capacitors into the white-space; and
 arraying the maximum number of decoupling capacitors into the white-space in accordance with one of the potential decoupling capacitor layouts computed.

15. The computer system of claim 13, wherein the calculating further comprises determining whether electrical connectivity constraints of the integrated circuit are met by the grid cell region defined.

16. The computer system of claim 13, wherein the calculating further comprises determining whether the number of fully embedded grid cells computed exceeds a maximum density threshold of the integrated circuit.

17. The computer system of claim 14, wherein the calculating further comprises determining whether electrical connectivity constraints of the integrated circuit are met by the grid cell region defined.

18. The computer system of claim 14, wherein the calculating further comprises determining whether the number of fully embedded grid cells computed exceeds a maximum density threshold of the integrated circuit.

19. The computer system of claim 18, wherein the grid cell region is spliced into a set of smaller grid cell regions if the maximum density threshold is not met.

* * * * *